(12) United States Patent
Clochard

(10) Patent No.: US 10,502,616 B2
(45) Date of Patent: Dec. 10, 2019

(54) SYSTEM FOR DETECTING THE PRESENCE AND POSITION OF HANDS AND/OR FINGERS NEAR A VEHICLE STEERING WHEEL

(71) Applicants: CONTINENTAL AUTOMOTIVE FRANCE, Toulouse (FR); CONTINENTAL AUTOMOTIVE GMBH, Hannover (DE)

(72) Inventor: Pascal Clochard, Chevreuse (FR)

(73) Assignees: CONTINENTAL AUTOMOTIVE FRANCE, Toulouse (FR); CONTINENTAL AUTOMOTIVE GMBH, Hannover (DE)

(*) Notice: Subject to any disclaimer, the term of this patent is extended or adjusted under 35 U.S.C. 154(b) by 231 days.

(21) Appl. No.: 15/534,018

(22) PCT Filed: Dec. 3, 2015

(86) PCT No.: PCT/EP2015/002439
§ 371 (c)(1),
(2) Date: Jun. 8, 2017

(87) PCT Pub. No.: WO2016/091367
PCT Pub. Date: Jun. 16, 2016

(65) Prior Publication Data
US 2018/0335340 A1    Nov. 22, 2018

(30) Foreign Application Priority Data
Dec. 9, 2014 (FR) .................... 14 62114

(51) Int. Cl.
*G01J 1/02* (2006.01)
*B62D 1/06* (2006.01)
(Continued)

(52) U.S. Cl.
CPC ............ *G01J 1/0238* (2013.01); *B62D 1/046* (2013.01); *B62D 1/06* (2013.01); *G01J 1/08* (2013.01);
(Continued)

(58) Field of Classification Search
CPC .......... G01J 1/0238; G01J 1/08; G01J 1/4228; G01J 1/44; G01J 2001/446; B62D 1/046;
(Continued)

(56) References Cited

U.S. PATENT DOCUMENTS 4,701,747 A    10/1987   Isherwood et al.
4,706,072 A *  11/1987   Ikeyama .............. B60K 28/063
                                                340/575
(Continued)

FOREIGN PATENT DOCUMENTS

CN    102785689    11/2012
CN    103957796    7/2014
(Continued)

OTHER PUBLICATIONS

International Search Report, dated Feb. 2, 2016, from corresponding PCT/EP2015/002439 application.

*Primary Examiner* — David P Porta
*Assistant Examiner* — Meenakshi S Sahu
(74) *Attorney, Agent, or Firm* — Young & Thompson

(57) ABSTRACT

Disclosed is a system for a motor vehicle, including a steering wheel (2) connected to the steering system of the vehicle, the steering wheel including a plurality of optical sensors (7) arranged on the rim (25) of the steering wheel and designed to detect the presence of at least one finger (5) of at least one hand of the driver near or in contact with the rim of the steering wheel, by way of which the system is able to determine the number of fingers near or in contact with the rim of the steering wheel as well as their respective (Continued)

positions on the rim. Also disclosed is a method associated with the device.

20 Claims, 3 Drawing Sheets

(51) Int. Cl.
*H03K 17/96* (2006.01)
*B62D 1/04* (2006.01)
*G01J 1/08* (2006.01)
*G01J 1/42* (2006.01)
*G01J 1/44* (2006.01)

(52) U.S. Cl.
CPC ............... *G01J 1/4228* (2013.01); *G01J 1/44* (2013.01); *H03K 17/9629* (2013.01); *H03K 17/9631* (2013.01); *G01J 2001/446* (2013.01); *H03K 2217/94108* (2013.01)

(58) Field of Classification Search
CPC .. B62D 1/06; H03K 17/9631; H03K 17/9629; H03K 2217/94108
USPC ....................................................... 250/338.4
See application file for complete search history.

(56) References Cited

U.S. PATENT DOCUMENTS

| | | |
|---|---|---|
| 5,651,384 A | 7/1997 | Rudrich |
| 8,451,109 B1 | 5/2013 | Daniel et al. |
| 2003/0189493 A1 | 10/2003 | Klausner et al. |
| 2005/0181159 A1 | 9/2005 | Weber et al. |
| 2005/0242965 A1 | 11/2005 | Rieth et al. |
| 2012/0296528 A1 | 11/2012 | Wellhoefer et al. |
| 2014/0054880 A1 | 2/2014 | Feinstein |
| 2014/0316227 A1 | 10/2014 | Rake et al. |

FOREIGN PATENT DOCUMENTS

| | | |
|---|---|---|
| DE | 10 2011 076174 A1 | 11/2012 |
| EP | 0 724 044 A1 | 7/1996 |
| EP | 1 292 485 B1 | 2/2004 |
| EP | 1 564 107 A1 | 8/2005 |
| FR | 2 555 522 A1 | 5/1985 |
| FR | 2 580 445 A1 | 10/1986 |
| GB | 2 161 266 A | 1/1986 |
| WO | 2004/022409 A2 | 3/2004 |
| WO | WO 2008077859 | 7/2008 |

* cited by examiner

SYSTEM FOR DETECTING THE PRESENCE AND POSITION OF HANDS AND/OR FINGERS NEAR A VEHICLE STEERING WHEEL

The present invention involves systems and methods allowing a detecting of the presence of one or more fingers and/or hands near the steering wheel of a motor vehicle.

More precisely, it deals with the way in which the driver of the vehicle grasps the steering wheel, in more or less active and firm manner, this information being transmitted to a system for monitoring the driver, and/or to a system of assisted or even automated driving.

BACKGROUND OF THE INVENTION

It is known how to measure the torque exerted by the hands of the driver on the steering wheel, for example in electrical assisted steering systems.

It is likewise known, from document US 2014 054 880 A1, how to arrange a plurality of sensors inside the rim of the steering wheel of a vehicle in order to detect a strong pressure exerted by the fingers and the hands of the driver, for example in order to control an airbag protection system.

However, the known systems do not allow for precise knowledge as to the number of fingers in active contact with the steering wheel to be obtained; neither do the known systems make it possible to detect whether the hands of the driver are not in contact with the steering wheel (steering wheel not being held). The systems detecting a torque exerted on the steering wheel are not able to discriminate whether the torque is provided by the hands or another part of the body, such as the knees for example, or whether the hands are simply put in place with no force exerted.

Thus, there is a need to propose an improved solution to allow the production of more fine and precise information to be provided to a third-party user system such as a driver monitoring system, and/or an assisted or even automated driving system.

SUMMARY OF THE INVENTION

According to the invention, there is proposed a method of detecting the presence of at least one hand of a driver near or in contact with the rim of a steering wheel for a motor vehicle, the steering wheel being connected to the steering system of the motor vehicle and comprising a plurality of optical sensors, arranged on the rim of the steering wheel and outfitted with infrared transmitting diodes and receiving photodiodes, the method involving the following steps:
  a) scanning the optical sensors,
     a1) capturing the light intensity received by the receiving diodes under natural illumination, the transmitting diodes not being active,
     a2) capturing the light intensity received by the receiving diodes under artificial illumination, namely, the transmitting diodes being active,
  b) deducing from this the number of fingers near or in contact with the rim of the steering wheel, including the "zero fingers" condition,
  c) repeating steps a) and b) or a), a1), a2), and b),
  d) providing real time and continual composite information (number of hands, number of fingers) to a third-party system.

This allows better reliability of detection regardless of the lighting conditions, in particular, when sunlight is present.

According to one embodiment, the plurality of optical sensors is formed by a series of optical sensors working in the infrared range, preferably in the wavelength range around 900 nm, being optionally formed by an alternation of infrared transmitting diodes and receiving photodiodes.

Advantageously, the composite information (number of hands, number of fingers) is provided to an assisted driving or monitoring system of the vehicle. Thus, precise information can be provided to an assisted driving or monitoring system for the driver.

Furthermore, the method may advantageously comprise the following function:
  e) identifying an always occulted position, even when the steering wheel is being turned, deducing from this that an element is permanently located at one or more particular sensors, and inhibiting the inclusion of information about this (these) particular sensor(s); this makes it possible to avoid the potential situation of an object or a band being fixed to the rim of the steering wheel; thus, a user cannot trick the monitoring system by permanently hiding one or more sensors; this function also allows the presence of an accessory attached to the rim of the steering wheel to be taken into account.

Furthermore, the invention likewise concerns a system for a motor vehicle, comprising a steering wheel connected to the steering system of the vehicle, the steering wheel comprising a plurality of optical sensors arranged on the rim of the steering wheel and designed to detect the presence of at least one finger of at least one hand of the driver near or in contact with the rim of the steering wheel, by means of which the system is able to precisely determine the number of fingers near or in contact with the rim of the steering wheel as well as their respective positions on the rim.

Advantageously, such a system of detection can furthermore determine the condition when no hand of the driver is grasping the rim of the steering wheel and no finger is in the immediate proximity of the rim, that is, the case when the steering wheel is not being held by the driver, or when the fingers of the driver are at a significant distance from the rim of the steering wheel.

Thanks to such a device, one can provide information as to the number of fingers to a third-party system, such as a monitoring system, and/or an assisted or even automated driving system, such as an active warning for crossing the center line, or an automatic queuing system in heavy traffic.

In various embodiments of the invention, one may optionally also make use of one and/or other of the following arrangements.

The optical sensors preferably allow for the capturing of objects up to a distance of at least 2 cm from the rim of the steering wheel; in this way, one can determine a condition where one finger is close to the rim of the steering wheel without being forcefully in contact, which allows for better informing of a user system as to the situation or intentions of the driver.

The optical sensors are preferably spaced apart from one another by at most 15 mm in the circumferential direction. Thus, it is easy to discriminate the objects captured and this allows a reliable detection of a single finger on the rim or near the rim and a determining of the position of this finger (or several fingers) in relation to the rim of the steering wheel;

The optical sensors are arranged on the rim one after the other, distributed over at least 200°, or at least 260°, in symmetrical manner with respect to the top point of the steering wheel. In this way, the zone of detection is sufficiently extensive for the various configurations of classical grasping of the steering wheel.

The optical sensors are arranged on the rim on the side opposite the driver; such a position is optimal for detecting the usual and most frequent cases of holding the steering wheel with the fingers; moreover, advantageously, the sensors are not visible from the viewpoint of the driver or the passenger.

The plurality of sensors is formed by a series of optical sensors working in the infrared range, preferably the wavelength range about 900 nm; one thus uses a mature technology, one which is economical, well mastered, and not subject to electromagnetic perturbations.

The arrangement of infrared diodes can be formed by an alternation of infrared transmitting diodes and receiving photodiodes. This makes it possible to carry out a comparative analysis on the one hand under natural light and on the other hand under artificial light, namely, forced illumination by the use of the transmitting diodes.

The system may further include a control unit connected to the sensors and designed to manage the detection information coming from the sensors and to furnish higher-level information as to the number of fingers and hands in contact with the rim of the steering wheel to another system. This allows one or more driving assistance systems to be informed efficiently.

BRIEF DESCRIPTION OF THE DRAWINGS

Other aspects, goals and advantages of the invention will appear upon perusal of the following description of one of its embodiments, given as a nonlimiting example. The invention will also be better understood by looking at the enclosed drawings, where.

DETAILED DESCRIPTION OF THE PREFERRED EMBODIMENTS

Figures 1, 2A, 2B:
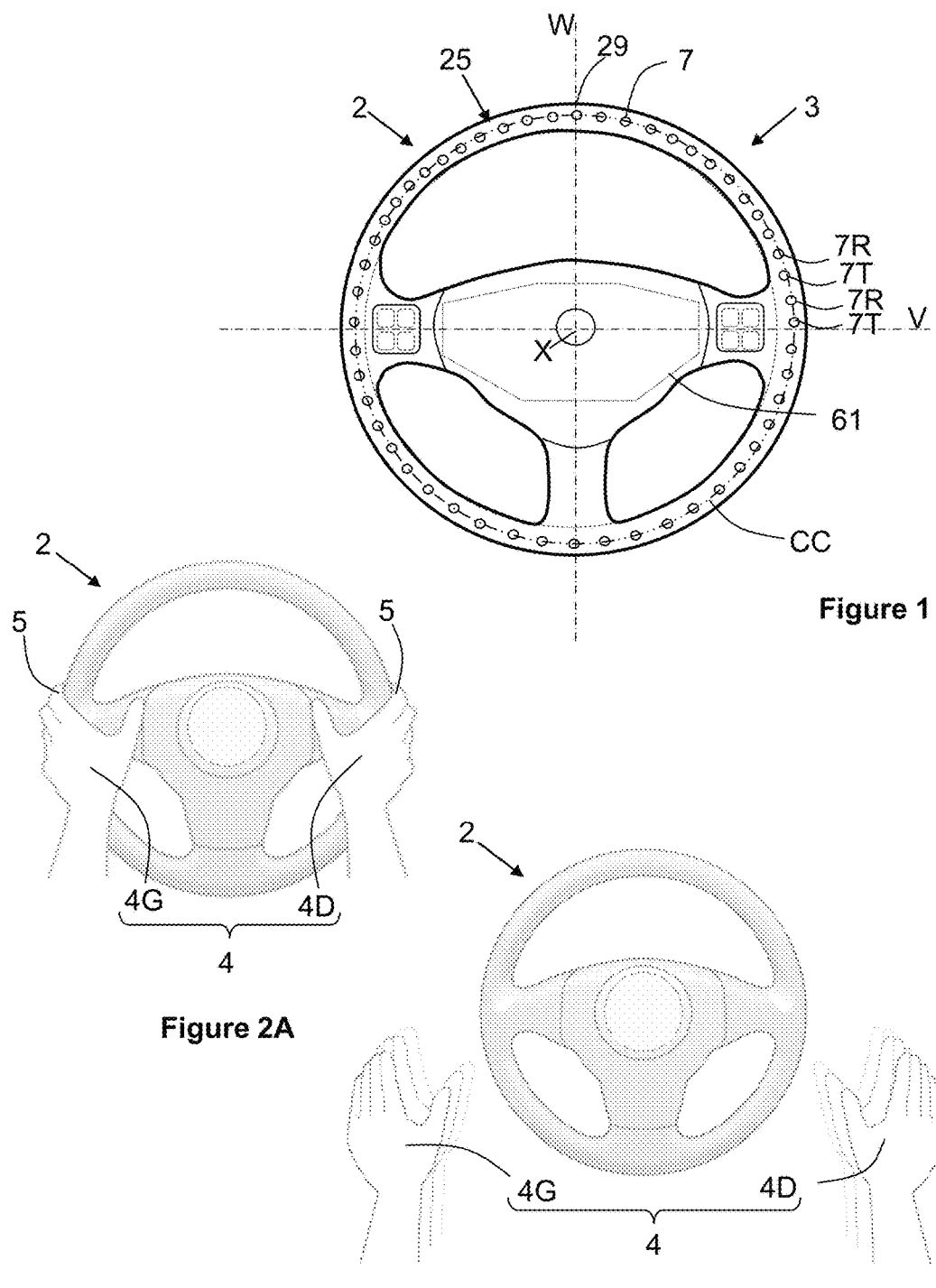
FIG. 1 shows a general diagram of a steering wheel of a vehicle comprising a detection system according to the invention.
FIGS. 2A and 2B show two driving configurations, respectively, with an active holding of the steering wheel and with the steering wheel not being held.

FIG. 1 represents a general diagram of a steering wheel 2 of a motor vehicle; it shows the steering wheel of the vehicle, connected to the steering system of the vehicle by a steering column with axis X. The steering wheel 2 comprises a detection device 3 whose principal purpose is to detect the quality of grasping of the steering wheel by a driver, but also to detect when the driver is not holding the steering wheel.

The steering wheel 2 comprises a central part 61 known as the hub and a rim 25 connected to the hub by three spokes in the example illustrated, but the number of spokes may be four or even two, or the steering wheel can be of the single-spoke type.

The detection device 3 comprises a plurality of sensors 7 arranged on the rim 25 of the steering wheel 2. In FIG. 2A, one sees that the hands 4 (the left hand 4G and the right hand 4D) grasp the steering wheel 2 in a "9 and 3" position. Of course, other classical positions such as "10 and 2", two-hand asymmetrical positions, and single-hand positions are also commonly used by the drivers.

The fingers of the hand 4 of the driver are designated by the reference 5. In FIG. 2B, the steering wheel 2 is not being held by the driver, a condition which must absolutely be detected by the method.

Figure 3:
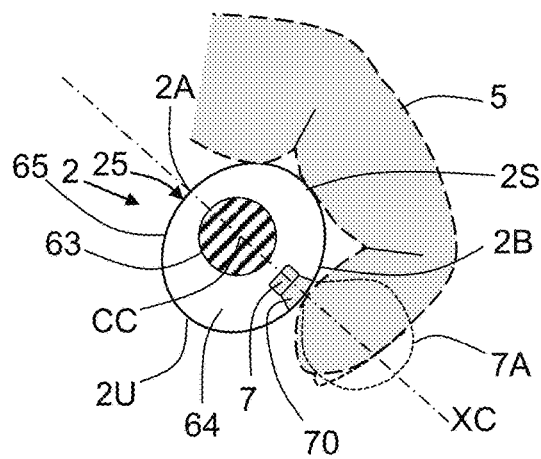
FIG. 3 shows a sectional view of the rim of the steering wheel of the system shown in FIG. 1.

In the example illustrated in FIG. 3, the rim 25 of the steering wheel 2 has a round or slightly oval section with a first front face 2A directed toward the driver, an opposite face 2B, oriented opposite the view of the driver, an upper face 2S on the outer portion of the rim 25, and a lower face 2U on the interior portion of the rim 25. The median direction of this section of rim 25, parallel to the X axis, is referenced as XC.

The rim 25 of the steering wheel 2 comprises a generally metallic framework 63 extending along a circle CC about the axis X of the steering wheel 2. Moreover, the rim 25 of the steering wheel 2 comprises a lining 64 of synthetic material, possibly covered with fabric or leather, the lining 64 possibly having a certain resilience and the exterior surface 65 possibly having a certain roughness for the adherence of the driver's hands.

In the example illustrated, detection sensors 7 are arranged on the side 2B of the rim 25 opposite the face visible to the driver, which makes it possible to detect generally the last joint of the finger 5 of the hand 4 (see FIG. 3). This position of the sensors 7 is also the best suited for them not being visible to the occupants of the vehicle.

However, it is noted that one could also install sensors, where appropriate, on the exterior upper face 2S, the interior face 2U and/or on the front face 2A.

Preferably, the sensors 7 are arranged one after the other in the circumferential direction CC.

Advantageously, the sensors are distributed over an angle sector of 360°, that is, they preferably cover the entire contour of the rim 25 of the steering wheel 2 along the circumferential direction CC.

Advantageously, the distribution of the sensors 7 is symmetrical in regard to the upper point 29 of the steering wheel 2 (when the motor vehicle is moving in a straight line).

It will be noted that it is not ruled out for the sensors 7 to cover a sector less than 360°, for example, of the order of 260°, or even for example of the order of 200°, to coincide with the customary grasping sectors in a statistical population of drivers.

Figure 4:
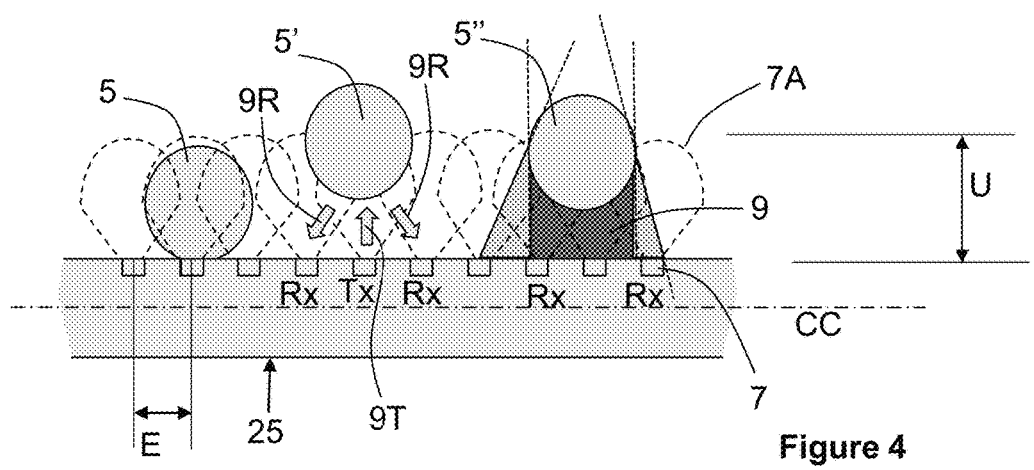
FIG. 4 shows a detail view of one example of optical sensors used in the system shown in FIG. 1.

According to an advantageous choice, the sensors 7 are spaced apart from one another by a distance E of at most 15 mm in the circumferential direction CC (see FIG. 4). This provides a sufficient precision to be able to discriminate the different potential objects detected, including the presence of a single finger 5 on the rim 25 of the steering wheel 2. As mentioned above, there can either be a single sensor 7 in a given radial position XC (see FIG. 3) or several sensors distributed at a given radial position XC (on the faces 2A, 2S, 2B).

The detection zone, in other words the radius of action of the sensors, can be larger or smaller in size depending on the technological choice of the sensors; in FIG. 4 there are shown typical zones of coverage 7A for optical sensors.

In the example represented, the detection sensors are optical sensors of photodiode type; a part 70 serving as an optical guide and closing part is arranged between the diodes themselves and the outer wall 65 of the rim 25. The optical closing part 70 is present as an annular band covering the entire surface where the optical sensors are arranged. The optical closing part 70 can be advantageously formed as a "tinted lens" to limit the penetration of radiation in the visible range to the sensors 7, especially in the case where one is working in the infrared range as detailed below. Optionally, one can also place a passive filter centered on the working wavelengths just in front of each photodiode. Such filtering makes it possible to eliminate unused portions of the spectrum and to improve the sensitivity of the detection.

Preferably, an infrared transmitting diode Tx (7T) and a receiving photodiode Rx (7R) will alternate along the circumferential direction CC. In this arrangement, when one of the transmitting diodes 7T is activated, we are interested in particular in the level of light reception at the two adjacent receiving diodes 7R.

According to one variant not shown, each optical sensor 7 is formed by an integrated pair (infrared transmitting diode-receiving photodiode).

According to yet another variant not shown, each infrared transmitting diode Tx is enclosed by two receiving photodiodes situated on either side in a radial direction (perpendicular to the plane containing the circle CC).

However, the alternation of an infrared transmitting diode Tx (7T) and a receiving photodiode Rx (7R) in the circumferential direction CC, associated with the sequential scanning of the sensors 7, proves to be particularly optimal because one photodiode is used sequentially in a pair with each of the two transmitting diodes which are adjacent to it.

The operating wavelength range is preferably about 900 nm, preferably between 850 nm and 940 nm, although lower values (750-850 nm) are not ruled out.

The radius of action 7A of the optical sensors 7 makes it possible to detect objects (and in particular the fingers 5) up to a distance U of 2 cm from the rim 25, for example, as measured from the rear face of the rim 25 of the steering wheel 2. Thus, a finger 5 which is several millimeters away from the rim 25 without touching it (referenced as 5', FIG. 4) is detected and located.

Figure 5:
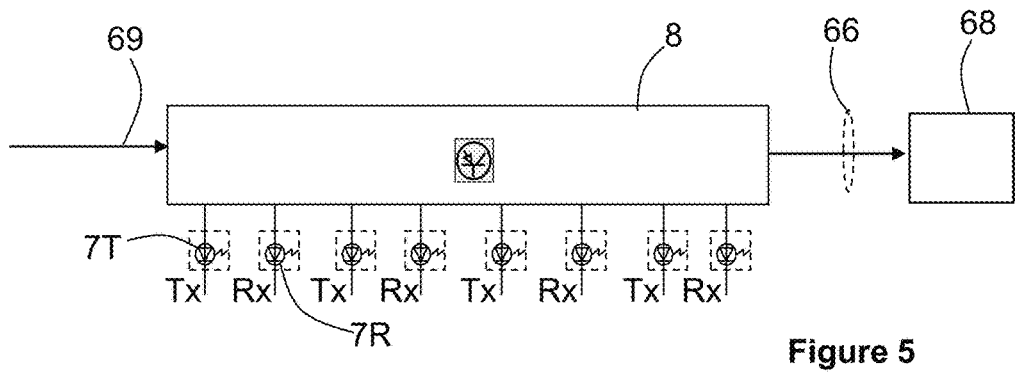
FIG. 5 shows a functional diagram of the capturing device, including in particular the sensors.

As illustrated in FIG. 5, the detection system 3 comprises, besides the sensors 7 already mentioned, an electronic processing unit 8, designed to manage detection information coming from the sensors 7. In particular, the processing unit 8 can perform a recurring scan of all of the diodes; including activating one of the transmitting diodes 7T and measuring at the same time the level of light reception on the two adjacent receiving diodes 7R.

In particular, the processing unit 8 identifies which sensor 7 (among the plurality) detects an object (total or partial occultation by a finger 5) and, depending on the geographical position of this sensor 7, it deduces the position of the finger 5 detected on the circumference of the rim 25, for example as expressed in the form of an angular deviation with respect to the top point 29 of the steering wheel 2.

The electronic processing unit 8 is adapted to provide upper-level information on the number of fingers 5 and hands 4 in contact with the rim 25 of the steering wheel 2, to another third-party user system 68, such as a monitoring system, and/or to an "AutoDrive" system, that is, an assisted or automatic driving system.

When the link between electronic processing unit 8 and the third party user system 68 is by wire, this goes through a rotary contactor 66.

Optionally, it may be provided that the transmission of information from the steering wheel 2 to a non-rotary element is done by infrared transmission, making use of infrared transmitters 7T present for the detection function, during periods when they are not requested for the detection; in this case, one does not have to go through a rotary contactor.

Figure 6:
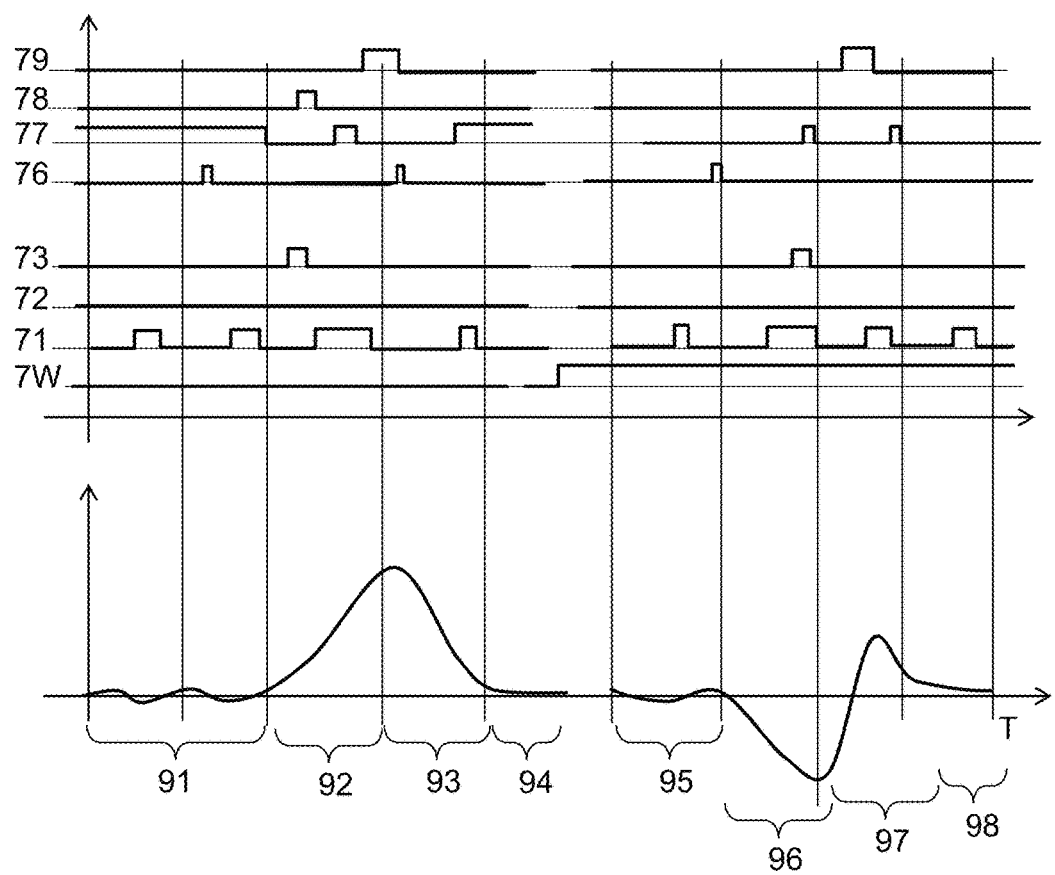
FIG. 6 shows a chronogram illustrating the detection of the fingers of the driver's hands.

The left half of FIG. 6 shows at top the signals coming from a certain number of sensors 71-73 and 76-79 among the assemblage of sensors present (typically numbering at least twenty or thirty). The chronogram at the bottom of FIG. 6 illustrates the angle of the steering wheel 2 ("steering wheel theta") with respect to a position of driving in a straight line.

During a first period referenced as 91, the driver is driving in a straight line ("steering wheel theta" near zero); the sensor referenced as 77 all the time detects the presence of a finger 5 (for example, finger 5 of the hand 4 which remains on the steering wheel 2) and the sensors referenced as 71, 76 detect from time to time a finger 5 (which may be the fingers 5 of the other moving hand 4, or fingers 5 which the driver moves in regular manner).

At the time referenced as 92, the driver turns the steering wheel 2 to negotiate a curve; since he moves his hands 4 on the steering wheel 2, certain sensors 7 are activated during the maneuver; in general during this phase, normally none of the sensors 7 is activated permanently by the fingers 5. In fact, several changes of state occur at the sensors 7 when the driver moves his hands 4 on the steering wheel 2.

At the time referenced as 93, the driver straightens out the steering wheel 2 to return to a straight line; here again, the driver moves his hands 4 on the steering wheel 2 or rather lets the steering wheel 2 slide by the natural rebounding in direction toward the straight line. Once more, there are naturally several changes in state of the sensors 7.

At the time referenced as 94, we again find a situation of steering similar to that of the first period 91 with little change in the sensor signals.

The method according to the invention can thus be formulated as a series of steps, as follows:
  a) scanning the optical sensors 7,
  b) deducing from this the number of fingers 5 near or in contact with the rim 25 of the steering wheel 2, including the "zero fingers" condition,
  c) repeating steps a) and b),
  d) providing real time and continual composite information (number of hands 4, number of fingers 5) to a vehicle monitoring or control system.

The composite information may comprise first of all the number of fingers 5 detected by the detection system.

Then the electronic processing unit 8 is designed to calculate, as a function of the spacing of the positions detected, whether the fingers 5 belong to the same hand 4 or to two distinct hands 4G, 4D. Thus, the composite information may furthermore comprise the number of fingers 5 detected, the number of hands 4 in contact with or near the rim 25 of the steering wheel 2, with the number of fingers 5 for each hand 4, as well as the angle position of each finger 5 detected in relation to the top point 29 of the steering wheel 2.

The number of fingers 5 and the number of hands 4 may be zero, which indicates that the steering wheel 2 is not being held by the driver. The composite information is refreshed in real time and may further include for each finger 5 detected the distance separating it from the rim 25 (distance equal to zero during contact, and non-zero distance if the finger is just in proximity). Such a precision of the composite information enables accurate and useful informing of an assisted driving system.

Figure 7:
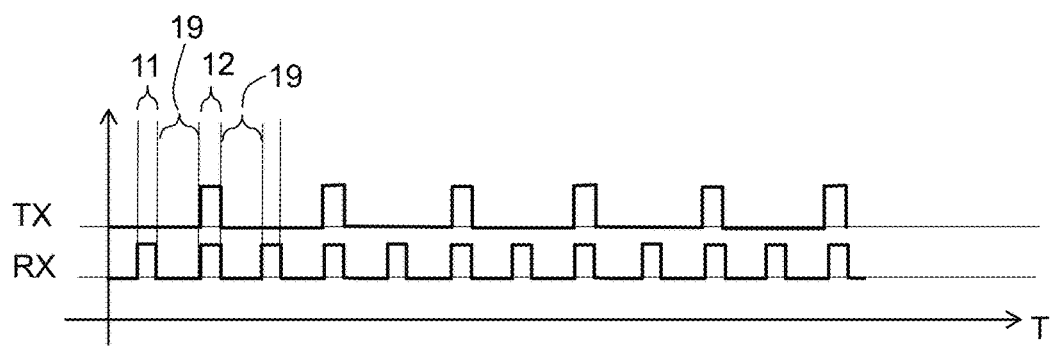
FIG. 7 shows another chronogram illustrating the optical detection under natural and artificial lighting.

According to one advantageous aspect illustrated in FIG. 7, it is provided that the optical sensors 7 can detect the light intensity received by the receiving diodes Rx, 7R under natural illumination, that is, emitting diodes Tx, 7T not activated (step a1), reference 11), and furthermore at a second time the light intensity received by the receiving diodes Rx, 7R is illuminated and then captured under artificial illumination, namely, with the transmitting diodes Tx, 7T activated (step a2), reference 12). Of course, the detection can preferably be pulsed, that is, the moments of detection are separated by dead time referenced 19, which makes it possible to minimize the electricity consumption and be less sensitive to variations in light coming from the outside, such as sunlight interfering with trees along the road or certain urban neon lighting.

It should be noted that in FIG. 7 the signals coming from the receiving diodes Rx, 7R and the transmitting diodes Tx, 7T are respectively referenced as RX and TX.

More precisely, and in connection with FIG. 4, when the transmitting diodes Tx are at rest, the quantity of light received by the photodiodes Rx is measured; if one or more photodiodes Rx receive a quantity of light significantly less than the others, this means that a finger 5" is present in proximity to the rim 25 of the steering wheel 2 (in fact, the finger 5" generates a shadow 9 as compared to the natural ambient lighting). When the finger 5" is completely concealing a sensor 7, the light intensity received is basically zero. On the other hand, the majority of the sensors 7 receive the ambient light level in this portion of the compartment of the vehicle, which makes it possible to determine the mean perceived reference light level.

During phases of artificial lighting, the supplemental light 9R provided by the reflection of the infrared illumination 9T furnished by the transmitting diode Tx which is reflected on the finger 5' of the driver is measured. Analysis of the supplemental quantity of light makes it possible to evaluate the distance of the finger 5' in relation to the outer surface 65 of the rim 25 of the steering wheel 2. The distance is thus evaluated with respect to the surface of the rim 25 up to U=20 mm.

In order to take account of nighttime driving conditions (compartment very weakly illuminated), for example a source of general ambient lighting may be provided in the instrument cluster, infrared or longer, replacing the natural daytime lighting.

It will be noted that in a simplified version, the sensors 7 in the rim 25 might only be photodiodes designed to measure the shadow 9 cast by the finger or fingers 5 as compared to the natural lighting or an artificial lighting situated for example in the instrument cluster.

According to one advantageous optional function, the electronic processing unit 8 is designed to detect an object which is permanently present at one (or more) contiguous sensors 7; this object may be an accessory (such as a satellite control) secured to the rim 25 of the steering wheel 2, but this object (for example an adhesive tape) may also have been put in place by the user to try to trick a monitoring system.

If a sensor, illustrated in the right half of FIG. 6 by the reference 7W, permanently detects an object, even when the steering wheel 2 is being turned in significant fashion (for example, more than a half-turn), this means that it does not involve fingers 5 of the driver but instead an object secured to the rim 25 of the steering wheel 2. The electronic processing unit 8 will then exclude from consideration this (or these) sensors 7, for example up until the moment when changes of state can once again be noted on this sensor 7; in other words, the sensors 7 permanently hidden are inhibited, especially for the function of producing composite information for the third-party monitoring system. In fact, the inhibited sensors 7 can no longer reflect the quality of grasping of the steering wheel 2 by the driver.

The invention claimed is:

1. A method of detecting a presence of at least one hand of a driver near or in contact with a rim (25) of a steering wheel (2) for a motor vehicle, the steering wheel (2) being connected to a steering system of the motor vehicle and equipped with a sensing system including a plurality of optical sensors (7) arranged on the rim (25) of the steering wheel (2), said optical sensors outfitted with infrared transmitting diodes (Tx, 7T) and receiving photodiodes (Rx, 7R), the method comprising:
   a) scanning the optical sensors (7), by
      a1) first capturing of a first light intensity of ambient illumination received by the receiving diodes (Rx, 7R) with the transmitting diodes (Tx, 7T) not being active, and
      a2) activating the transmitting diodes (Tx, 7T) and second capturing of a second light intensity received by the receiving diodes (Rx, 7R) that includes reflected light of an illumination generated by the activated transmitting diodes (Tx, 7T);
   b) deducing, from the first captured light intensity and the second captured light intensity of the scanning, a count of zero or more fingers (5) of the driver near or in contact with the rim (25) of the steering wheel (2); and
   c) deducing, from the first captured light intensity and the second captured light intensity of the scanning, a count of zero or more hands of the driver in contact with the steering wheel,
   where steps a), a1), a2), and b) are carried out repeatedly, and real time and continual composite information, including updated counts of the driver's hands and updated counts of the driver's fingers, are provided from the sensing system to a third-party system.

2. The method of detection as claimed in claim 1, wherein the plurality of optical sensors (7) is arranged on a side of the steering wheel opposite the driver.

3. The method of detection as claimed in claim 1, wherein the plurality of optical sensors (7) is arranged as an alternation of said transmitting diodes (Tx, 7T) and said receiving photodiodes (Rx, 7R) such that any adjacent pair of said receiving photodiodes (Rx, 7R) has a transmitting diode of said transmitting diodes (Tx, 7T) positioned therebetween.

4. The method of detection as claimed in claim 1, wherein the third-party system to which said composite information is provided is any of an assisted driving system of the vehicle and a monitoring system of the vehicle.

5. The method of detection as claimed in claim 1, further comprising:
   identifying, from said scanning, a position along the rim (25) of the steering wheel (2) of one or more of the optical sensors (7) that is persistently occulted, including when the steering wheel (2) is operatively being turned; and
   deducing from said identifying that an object is permanently located at the position of the one or more optical sensors (7), and inhibiting the inclusion of information of the one or more optical sensors (7) in the composite information provided from the sensing system to the third-party system.

6. A system for a motor vehicle to detect a presence of at least one hand of a driver near or in contact with a rim (25) of a steering wheel (2) of the steering system of the motor vehicle, comprising:

a plurality of optical sensors (7) arranged on the rim (25) of the steering wheel (2), the plurality of optical sensors (7) configured to detect a presence of at least one finger (5) of the at least one hand (4) of the driver near or in contact with the rim (25) of the steering wheel (2), said optical sensors including infrared transmitting diodes (Tx, 7T) and receiving photodiodes (Rx, 7R); and an electronic processing unit (8) in communication with the plurality of optical sensors (7), configured to repeatedly scan the optical sensors (7), by first capturing of a first light intensity of ambient illumination received by the receiving diodes (Rx, 7R) with the transmitting diodes (Tx, 7T) not being active, and activating the transmitting diodes (Tx, 7T) and second capturing of a second light intensity received by the receiving diodes (Rx, 7R) that includes reflected light of an illumination generated by the activated transmitting diodes (Tx, 7T), by means of which the electronic processing unit (8) determines a number of fingers (5) of the driver near or in contact with the rim (25) of the steering wheel (2) as well as respective positions of the fingers of the driver on the rim (25).

7. The method of detection as claimed in claim 1, wherein the plurality of optical sensors (7) are configured to operate in a wavelength range between 850 nm to 940 nm.

8. The method of detection as claimed in claim 2, wherein the plurality of optical sensors (7) is arranged as an alternation of said transmitting diodes (Tx, 7T) and said receiving photodiodes (Rx, 7R) such that any adjacent pair of said receiving photodiodes (Rx, 7R) has a transmitting diode of said transmitting diodes (Tx, 7T) positioned therebetween.

9. The method of detection as claimed in claim 2, wherein the third-party system to which said composite information is provided is any of an assisted driving system of the vehicle and a monitoring system of the vehicle.

10. The method of detection as claimed in claim 3, wherein the third-party system to which said composite information is provided is any of an assisted driving system of the vehicle and a monitoring system of the vehicle.

11. The method of detection as claimed in claim 2, further comprising:

identifying, from said scanning, a position along the rim (25) of the steering wheel (2) of one or more of the optical sensors (7) that is persistently occulted, including when the steering wheel (2) is operatively being turned;

deducing from said identifying that an object is permanently located at the position of the one or more optical sensors (7), and inhibiting the inclusion of information of the one or more optical sensors (7) in the composite information provided from the sensing system to the third-party system.

12. The method of detection as claimed in claim 3, further comprising:

identifying, from said scanning, a position along the rim (25) of the steering wheel (2) of one or more of the optical sensors (7) that is persistently occulted, including when the steering wheel (2) is operatively being turned; and deducing from said identifying that an object is permanently located at the position of the one or more optical sensors (7), and inhibiting the inclusion of information of the one or more optical sensors (7) in the composite information provided from the sensing system to the third-party system.

13. The method of detection as claimed in claim 4, further comprising:

identifying, from said scanning, a position along the rim (25) of the steering wheel (2) of one or more of the optical sensors (7) that is persistently occulted, including when the steering wheel (2) is operatively being turned; and deducing from said identifying that an object is permanently located at the position of the one or more optical sensors (7), and inhibiting an inclusion of information of the one or more optical sensors (7) in the composite information provided from the sensing system to the third-party system.

14. The system as claimed in claim 6, wherein the plurality of optical sensors (7) is arranged on a side of the steering wheel opposite the driver.

15. The system as claimed in claim 6, wherein the plurality of optical sensors (7) is arranged as an alternation of said transmitting diodes (Tx, 7T) and said receiving photodiodes (Rx, 7R) such that any adjacent pair of said receiving photodiodes (Rx, 7R) has a transmitting diode of said transmitting diodes (Tx, 7T) positioned therebetween.

16. The system as claimed in claim 6, wherein the third-party system to which said composite information is provided is any of an assisted driving system of the vehicle and a monitoring system of the vehicle.

17. The system as claimed in claim 6, wherein the electronic processing unit (8) is further configured to identify, from said scanning, a position along the rim (25) of the steering wheel (2) of one or more of the optical sensors (7) that is persistently occulted, including when the steering wheel (2) is operatively being turned, and deduce from said identifying that an object is permanently located at the position of the one or more optical sensors (7) and inhibit an inclusion of information of the one or more optical sensors (7) in the composite information provided from the sensing system to the third-party system.

18. The system as claimed in claim 6, wherein the plurality of optical sensors (7) is configured to operate in a wavelength range between 850 nm to 940 nm.

19. The system as claimed in claim 14, wherein the plurality of optical sensors (7) is arranged as an alternation of said transmitting diodes (Tx, 7T) and said receiving photodiodes (Rx, 7R) such that any adjacent pair of said receiving photodiodes (Rx, 7R) has a transmitting diode of said transmitting diodes (Tx, 7T) positioned therebetween.

20. The system as claimed in claim 14, wherein the third-party system to which said composite information is provided is any of an assisted driving system of the vehicle and a monitoring system of the vehicle.

* * * * *